United States Patent [19]

Chong et al.

[11] Patent Number: 5,144,264
[45] Date of Patent: Sep. 1, 1992

[54] WIDEBAND VOLTAGE CONTROLLED OSCILLATOR HAVING OPEN LOOP GAIN COMPENSATION

[75] Inventors: Thomas C. K. Chong; Prakash Chacko, both of Celugor/Penang, Malaysia

[73] Assignee: Motorola, Inc., Schaumburg, Ill.

[21] Appl. No.: 786,697

[22] Filed: Nov. 1, 1991

[51] Int. Cl.⁵ .............................................. H03B 5/00
[52] U.S. Cl. .................................. 331/117 R; 331/175
[58] Field of Search ........ 331/108 R, 117 R, 117 FE, 331/167, 175

[56] References Cited

U.S. PATENT DOCUMENTS

| | | | |
|---|---|---|---|
| 4,066,983 | 1/1978 | Gallani et al. | 331/117 R |
| 4,074,209 | 2/1978 | Lysobey | 331/117 R |
| 4,510,465 | 4/1985 | Rice et al. | |
| 4,591,809 | 5/1986 | Regan et al. | 331/117 R |
| 4,621,241 | 11/1986 | Kiser | 331/175 |
| 4,968,952 | 11/1990 | Kehler, Jr. | |
| 5,075,643 | 12/1991 | Einbinder | 331/117 R |

*Primary Examiner*—Robert J. Pascal
*Attorney, Agent, or Firm*—Pedro P. Hernandez

[57] ABSTRACT

A voltage control oscillator (400) includes a tank circuit (402) wihch includes a control input (118). The VCO (400) further includes a feedback section (106) which includes a transistor (108). The feedback circuit (106) further includes a feedback compensation circuit 420 which compensates the feedback ratio of the feedback circuit (106) over changes in frequency of operation in order to provide for a substantially constant open loop gain. The improved VCO (400) provides for fairly constant current drain over changes in frequency as well as lower power output variations and flatter Side Band Noise Ratio response over frequency.

12 Claims, 5 Drawing Sheets

WIDEBAND VOLTAGE CONTROLLED OSCILLATOR HAVING OPEN LOOP GAIN COMPENSATION

TECHNICAL FIELD

This invention relates generally to oscillator circuits, and more specifically to an open loop gain compensated voltage controlled oscillator.

BACKGROUND

In a wideband voltage controlled oscillator for use in a two-way radio (e.g., in the range of 70–80 MHz bandwidth), it is typical for the drive current, and hence output power of the oscillator circuit to increase as the frequency of operation of the VCO increases. In a typical wideband Colpitts VCO circuit, the input current variation can be as much as 1 mA, and power output can vary by approximately 3 dB. These variations can be detrimental where the radio specifications do not allow for them. For example, where there is a great need to conserve current when the VCO is in the receive (Rx) mode in order to minimize the overall current drain of the radio. The problem with output variations is that a large VCO output variation will drive the buffer stage that is coupled to the output of the VCO differently, over variations in frequency and hence affect the gain and current drain of the buffer stage as well.

The overall sideband noise ratio (SBNR) of the message transmitted by the two-way radio is also affected by current variations (e.g., variations greater than 0.5 ma) in the VCO. These current variations can have significant effects on the flatness of the SBNR curve over frequency. This is mainly due to the dependency of the SBNR on the power feedback to the VCO transistor and in the transistor noise figure, which varies over current. Also, the lower the feedback resistance (see Rf 116 in FIG. 1) in the feedback loop (e.g., Rf<50 ohms), the greater the sensitivity of the SBNR to variations in current. In typical Colpitts VCO circuits SBNR becomes a problem since Rf is typically a low resistance.

In FIG. 1, a conventional Colpitts VCO 100 is shown. Oscillator 100 comprises several sections which include: a conventional electronic tank section 102, feedback section 106 including active element 108, and a biasing section 104. Some of the key parts of oscillator 100 that will be of interest, due to their relationship to the present invention, are found in feedback section 106 and include: feedback resistor (Rf) 116, capacitor (C1) 112, capacitor (C2) 110, capacitor (C3) 114, inductor 122 and active device (transistor) 108. VCO 100 further includes an input control voltage terminal 118, a negative input control voltage (−VEE), a positive bias voltage input (Vcc) and a VCO output port 120, which is subsequently coupled to a buffer stage (not shown). NPN transistor (gain element) 108 includes a control terminal which is the base of the transistor, a first terminal which is the collector and a second terminal which is the emitter of the transistor.

In FIG. 2 an AC model of the VCO circuit of FIG. 1 is shown. FIG. 2 takes away all DC components associated with FIG. 1. Varactor (Cv) 202 is the equivalent tuning capacitor of the varactor tank 102. FIG. 2 also shows capacitor (C1) 208, capacitor (C2) 210, capacitor (C3) 206, feedback resistor (Rf) 216, transistor (active element) 212, inductor (L) 204 and VCO load (RL) 214.

For analysis, FIG. 2 can be transformed into an open loop AC model as shown in FIG. 3 which utilizes the hybrid-$\pi$ transistor model. Where (V1) is the feedback voltage at the base of the transistor, (V2) is the feedback network input voltage and section 302 is the equivalent inductance of the tuning network. A further simplification of the open loop model of FIG. 3, is an amplifier having an amplifier gain of "A", in series with a feedback network having a feedback ratio of "$\beta$" coupled to the output of the amplifier. The amplifier having an input voltage of (V1 as shown in FIG. 3) and the feedback network having an input voltage of (V2).

The feedback ratio for FIG. 3 can be calculated as follows, $$\beta = \frac{V1}{V2} = \frac{Z_{C1}}{Z_{C1} + Z_{L3}} = \frac{1}{1 - \omega o^2 L3 C1}$$

where L3 equals the equivalent inductance of tuning network 302.

$$\text{Since } \omega o \text{ (resonance frequency)} = \frac{1}{\sqrt{L3 C1 // C2}},$$

where $$C1 // C2 = \frac{C1 C2}{C1 + C2},$$

therefore $$\beta = -\frac{C2}{C1}$$

(equation number 1).
An electrical analysis (possibly utilizing any one of many commercially available circuit analysis programs) of the hybrid-$\pi$ open loop model of FIG. 3 shows that the open loop gain increases as the frequency of operation of the VCO increases. As a result, the current drain of the VCO increases with frequency. A need therefore exists for a VCO having fairly level current drain, as well as lower SBNR and fairly constant power output over a wide operating frequency range in order to avoid the current, power, and SBNR variations associated with conventional wideband oscillators.

SUMMARY OF THE INVENTION

Briefly described, the present invention contemplates a voltage controlled oscillator for operation in a predetermined operating frequency range, comprising an active element and a feedback means coupled to the active element for providing feedback to the active element. The feedback means includes a feedback compensation means for compensating the feedback ratio ($\beta$) of the feedback means over changes in operating frequency in order to provide for substantially constant open loop gain over the predetermined operating frequency range.

In another aspect of the present invention, a communication device includes a voltage controlled oscillator according to the present invention.

DETAILED DESCRIPTION OF THE PREFERRED EMBODIMENT

Figure 1:
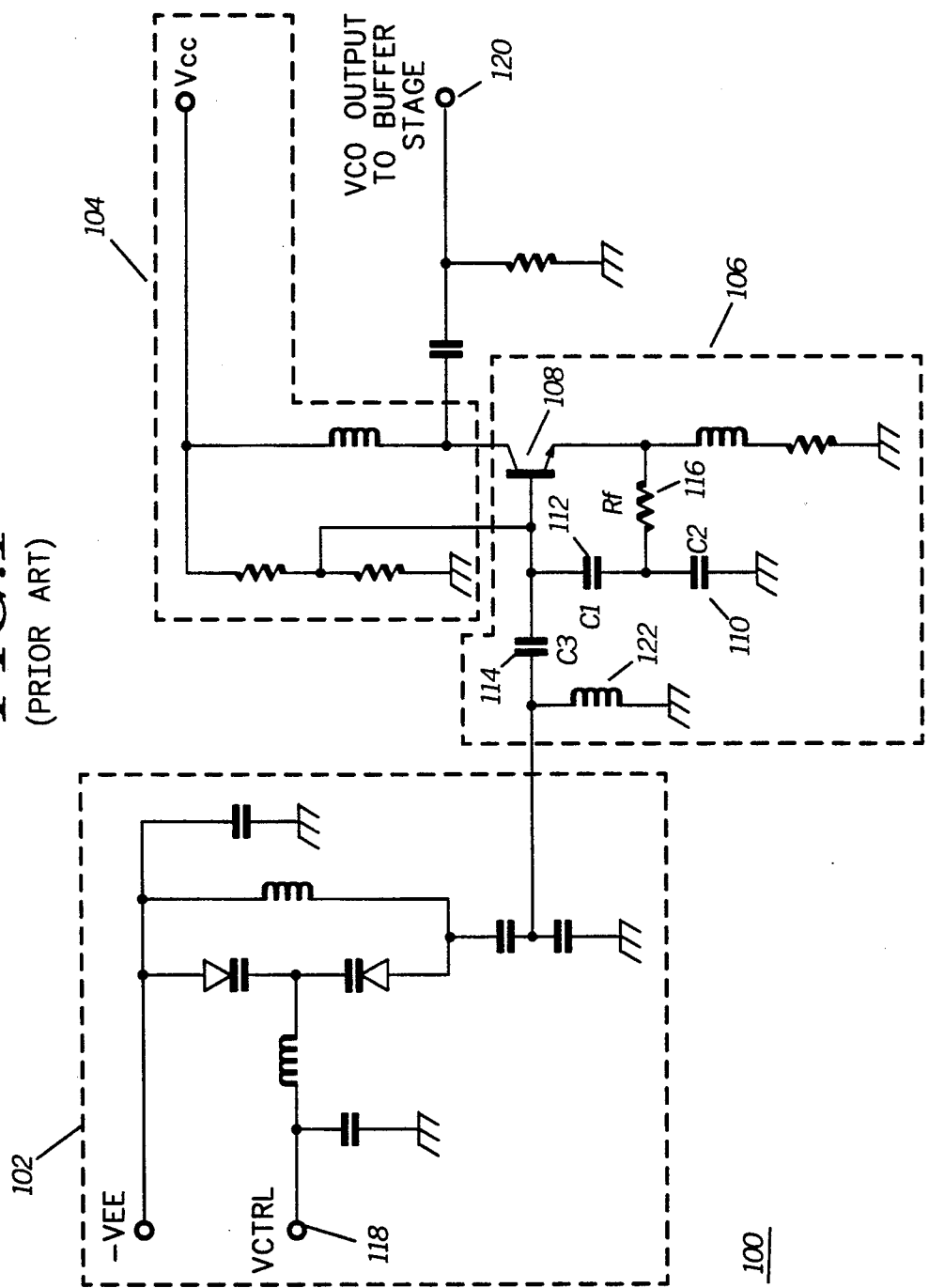
FIG. 1 is a schematic of a prior art Colpitts voltage-controlled oscillator (VCO).
Figure 2:
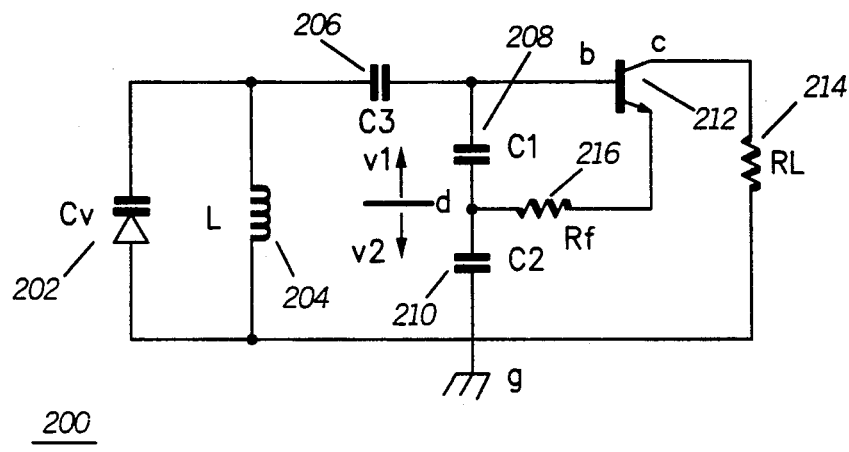
FIG. 2 is an AC model of the VCO circuit of FIG. 1.
Figure 3:
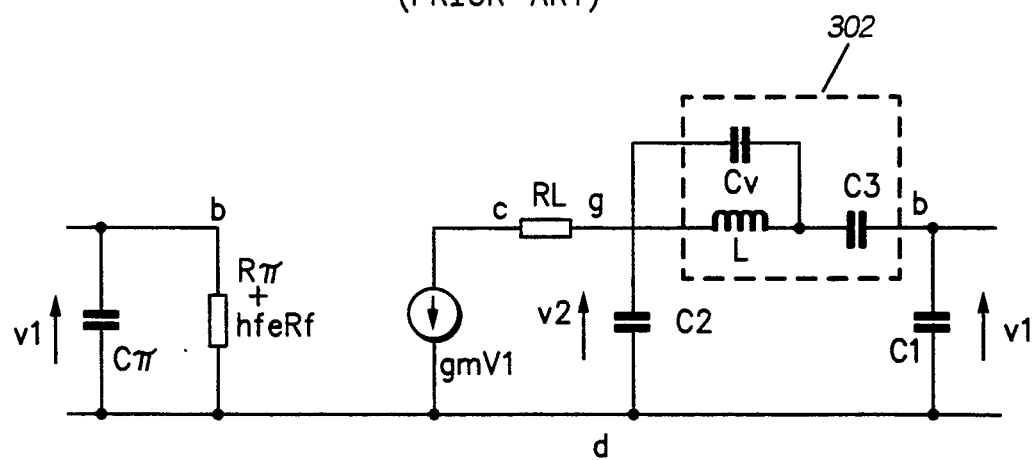
FIG. 3 is an open loop AC model using the hybrid-$\pi$ transistor model of FIG. 1.

A way of levelling the current drain of the VCO of FIG. 1 over operating frequency is to level the open loop gain of the VCO. To accomplish this, the present invention reduces the feedback ratio, $\beta$, over frequency. The feedback voltage, (V1), thereby becomes greater at the lower frequency end of operation, compared to the higher frequency end, because ($\beta$) is inversely proportional to C1 as shown in equation 1. The result is that the open loop gain is boosted at the lower frequency end which levels off the open loop gain of the circuit. Therefore, if the capacitance of capacitor (C1) 112 is increased gradually, as the operating frequency is increased, and if the rate of change of the capacitance tracks the change in operating frequency properly, the open loop gain will be held substantially constant over frequency. Thereby, providing for fairly constant current drain and power output over changes in operating frequency.

A circuit whose equivalent capacitance increases with frequency is that of an inductor and capacitor in series (series L-C circuit). Its equivalent capacitance is given by:

$$Ceq(\omega) = \frac{C}{1 - \left(\frac{\omega}{\omega o}\right)^2} \text{ for } \omega < \omega o$$

where $$\omega o \text{ (resonance frequency)} = \frac{1}{\sqrt{LC}}.$$

In a series L-C circuit as the frequency of operation increases for the condition where $\omega < \omega o$ (operating frequency less than resonance frequency), the capacitance of the circuit increases as the frequency is increased.

Figure 4:
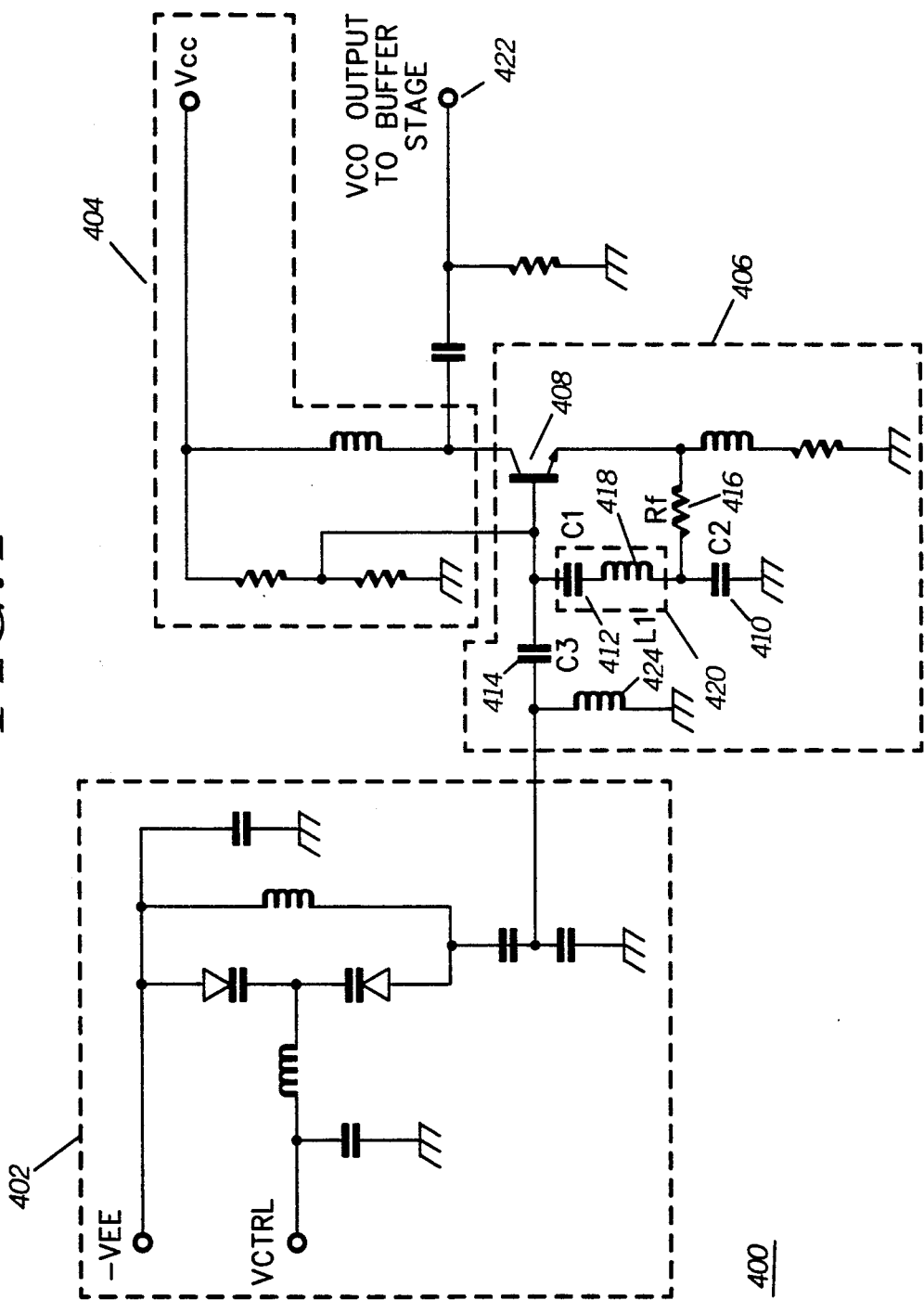
FIG. 4 is a schematic of a VCO in accordance with the present invention.

In FIG. 4, a Colpitts VCO 400 in accordance with the present invention is shown. VCO 400 includes a feedback means including feedback resistor (Rf) 416, feedback compensation means 420 and capacitor (C2) 410. Instead of using only a capacitor (C1) 412 in the feedback path back to the base (control terminal) of active element (transistor) 408, an inductor (L1) 418 is also added in series in the feedback path. The combined series L-C circuit (compensation means) 420 provides for compensation of the feedback ratio "$\beta$" over frequency, thereby providing for fairly constant open loop gain of the VCO 400 over changes in operating frequency. The change provided by the compensation means (series L-C circuit) 420 is gradual and provides for greater feedback at the low operating frequency end, while providing less feedback at the higher operating frequency end. At the lower frequencies, the greater feedback provided by L-C circuit 420 compensates for the higher reactance of the feedback network at the lower frequency. While at the higher operating frequency end, circuit 420 compensates for the lower reactance of the feedback network by lowering the feedback ratio "$\beta$".

Figure 5:
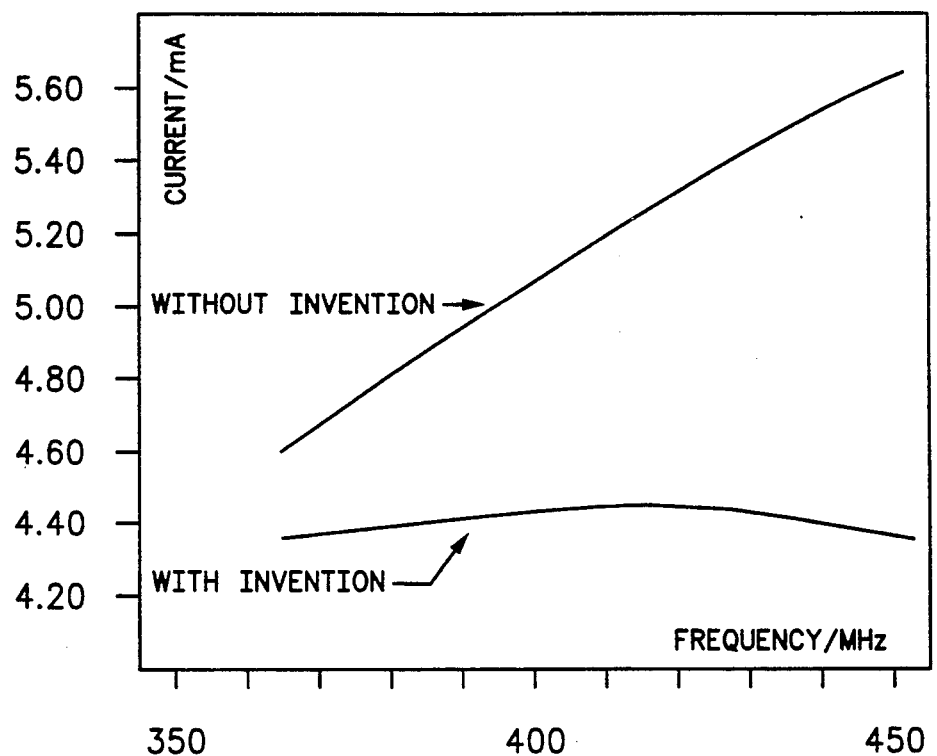
FIG. 5 is a plot of current over frequency for both a conventional oscillator and an oscillator utilizing the present invention.

In FIG. 5 a plot of current over frequency for both a conventional VCO 100 such as the VCO in FIG. 1 (VCO not utilizing inductor 418) and a VCO utilizing the present invention, such as VCO 400, is shown (for a portion of the UHF frequency band). One set of typical component values for the components of FIG. 4 are; 5.1 picofarad (pF) for both C1 and C2, 2.7 pF for C3, 15.2 nano-Henries (nH) for inductor 424 and 18 nH for L1. The component values utilized for other circuits will depend on several factors, including frequency of operation, bandwidth required, operating characteristics required, transistor characteristics, etc. Prior to adding the feedback compensation means the gain of VCO 100 (without inductor 418) varied from having a gain of approximately 2 at 365 MHz to approximately 2.7 at 440 MHz. With the addition of the feedback compensation means 420, the gain of VCO 400 became substantially constant over the full bandwidth of operation, with simulation numbers of approximately 2.2 at 360 MHz and 2.35 at 440 MHz, a substantial improvement over the prior design.

As can be seen in FIG. 5, the use of the present invention provides for a fairly constant current drain over changes in frequency, as compared to prior art VCO's (not utilizing inductor 418), such as that shown in FIG. 1. The fairly constant current drain achieved provides for a VCO that draws less current overall then that of prior art designs.

Figure 6:
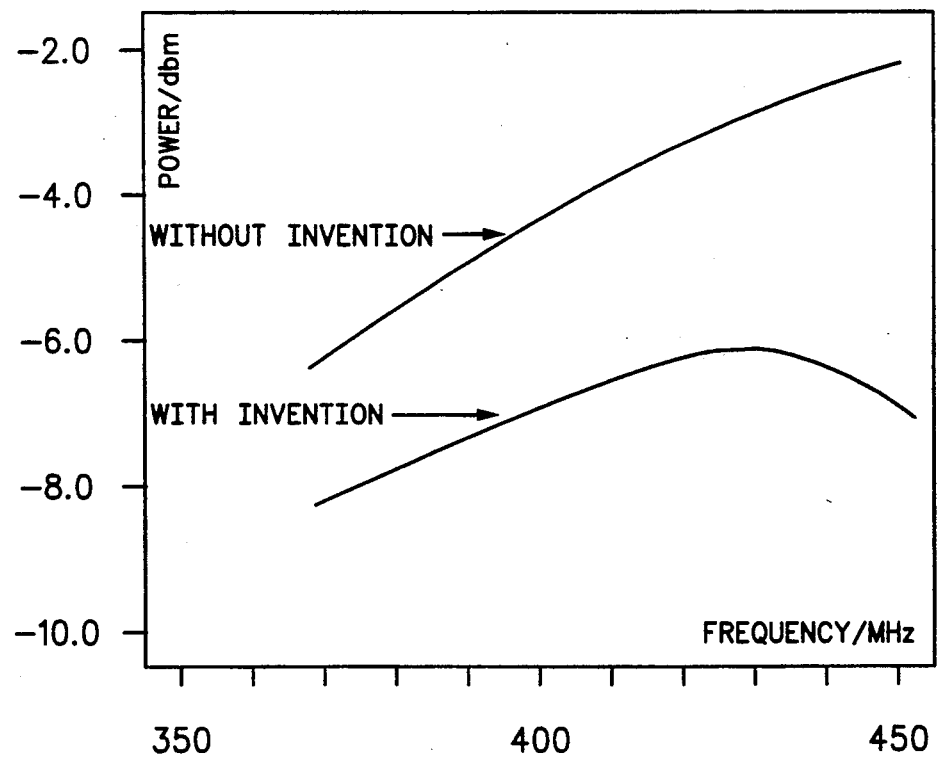
FIG. 6 is a plot of power over frequency for both a conventional oscillator and an oscillator utilizing the present invention.

In FIG. 6 a plot of power output over frequency for both a conventional oscillator such as VCO 100 and an oscillator utilizing the present invention such as VCO 400, is shown. Again, a dramatic improvement in power output levelling can be attributed to the present invention. Power output levelling in a typical comparison test analysis showed an improvement from 3.9 db down to 2.0 db with the circuit utilizing the present invention.

Figure 7:
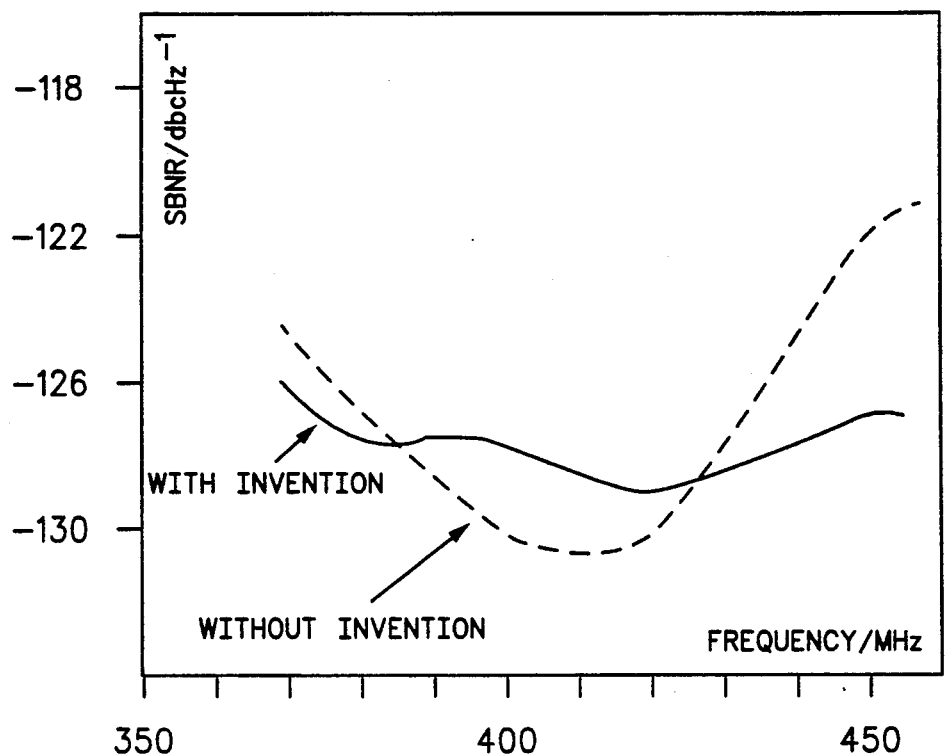
FIG. 7 is a plot of sideband noise ratio over frequency for both a conventional oscillator and an oscillator utilizing the present invention.

In FIG. 7 a plot of sideband noise ratio over frequency for both a conventional oscillator and an oscillator utilizing the present invention is shown. SBNR levelling improved from about 10 dB to approximately 3.4 dB.

Figure 8:
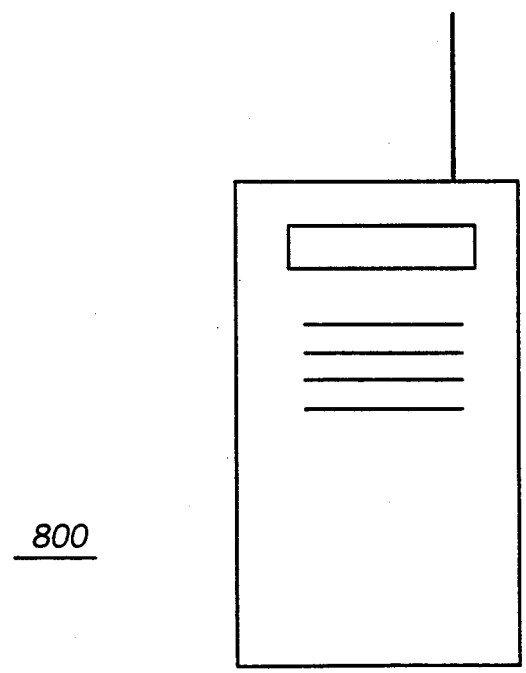
FIG. 8 is a drawing of a radio in accordance with the present invention.

FIG. 8 illustrates a drawing of a radio in accordance with the present invention. Radio 800 can be a two-way radio as known in the art. Radio 800 utilizes a VCO circuit as described in FIG. 4 using a frequency compensated feedback such as circuit 420. In addition, radio 800 includes conventional receiver and transmitter sections as known in the art.

In summary, a VCO circuit 400 which includes an open loop compensation circuit 420 has been shown. By compensating the VCO circuit 400 over frequency, a much improved VCO is provided. The improved VCO 400 has lower and much more stable current drain characteristics over frequency. Not to mention, improved output power levelling, as well as flatter SBNR characteristics. The current invention is far more simple in terms of part count, less expensive to manufacture and easier to design than any prior art voltage or current sensing methods. Although the preferred embodiment has been shown as a Colpitts VCO, other VCO designs such as Clapp and Pierce oscillators can also utilize the benefits of the present invention. Overall, the present invention provides for a cost effective solution to the major problems which are found when designing wide band VCO circuits.

What is claimed is:

1. A voltage controlled oscillator for operating within a predetermined operating frequency range, comprising:
   an active element; and
   feedback means coupled to the active element for providing feedback to the active element, the feedback means including a feedback compensation means for decreasing the feedback ratio ($\beta$) of the feedback means as the operating frequency of the voltage controlled oscillator is increased and for providing for a substantially constant open loop gain over the predetermined operating frequency range.

2. The voltage controlled oscillator of claim 1, wherein the feedback compensation means includes a reactive circuit which increases capacitance as the operating frequency of the voltage controlled oscillator increases.

3. The voltage controlled oscillator of claim 1, wherein the feedback compensation means comprises an inductor and capacitor coupled in series.

4. The voltage controlled oscillator of claim 3, wherein the voltage controlled oscillator is a Colpitts voltage-controlled oscillator.

5. A Colpitts voltage-controlled oscillator for operating in a predetermined operating frequency range, comprising:
   a transistor having a control terminal and first and second terminals; and
   feedback means coupled between the second terminal and the control terminal of the transistor, the feedback means providing feedback to the transistor, said feedback means including a feedback compensation means for decreasing the feedback ratio ($\beta$) of the feedback means as the operating frequency is increased within the predetermined operating frequency range and for providing for a substantially constant open loop gain over the predetermined operating frequency range.

6. The Colpitts voltage controlled oscillator of claim 5, wherein the feedback compensation means includes a series coupled inductor and capacitor.

7. The Colpitts voltage-controlled oscillator of claim 5, wherein the feedback compensation means increases capacitance as the operating frequency of the Colpitts voltage-controlled oscillator increases.

8. A communication device comprising:
   a receiver section; and
   a voltage controlled oscillator for operating in a predetermined operating frequency range, including:
   an active element; and
   feedback means coupled to the active element for providing feedback to the active element, the feedback means including a feedback compensation means for decreasing the feedback ratio ($\beta$) of the feedback means as the operating frequency is increased within the predetermined operating frequency range and for providing for a substantially constant open loop gain over the predetermined operating frequency range.

9. The communication device of claim 8, wherein the feedback compensation means includes a reactive circuit.

10. The communication device of claim 8, wherein the feedback compensation means comprises an inductor and capacitor coupled in series.

11. The communication device of claim 8, wherein the feedback compensation means comprises an inductor and capacitor coupled in parallel.

12. The communication device of claim 10, wherein the voltage controlled oscillator is a Colpitts voltage-controlled oscillator.

* * * * *